US008169825B1

(12) United States Patent
Shalvi et al.

(10) Patent No.: US 8,169,825 B1
(45) Date of Patent: May 1, 2012

(54) RELIABLE DATA STORAGE IN ANALOG MEMORY CELLS SUBJECTED TO LONG RETENTION PERIODS

(75) Inventors: Ofir Shalvi, Ra'anana (IL); Naftali Sommer, Rishon Lezion (IL); Barak Rotbard, Tel Aviv (IL); Oren Golov, Hod Hasharon (IL); Micha Anholt, Tel Aviv (IL); Uri Perlmutter, Ra'anana (IL)

(73) Assignee: Anobit Technologies Ltd., Herzliya (IL)

( * ) Notice: Subject to any disclaimer, the term of this patent is extended or adjusted under 35 U.S.C. 154(b) by 105 days.

(21) Appl. No.: 12/551,567

(22) Filed: Sep. 1, 2009

Related U.S. Application Data (60) Provisional application No. 61/141,866, filed on Dec. 31, 2008, provisional application No. 61/120,968, filed on Dec. 9, 2008, provisional application No. 61/105,819, filed on Oct. 16, 2008, provisional application No. 61/096,808, filed on Sep. 14, 2008, provisional application No. 61/093,613, filed on Sep. 2, 2008.

(51) Int. Cl.
*G11C 11/34* (2006.01)
(52) U.S. Cl. ............ 365/185.09; 365/226; 365/227; 365/228; 365/189.2; 365/189.17
(58) Field of Classification Search ............ 365/189.09, 365/189.11, 226, 228, 229, 185.09, 227, 365/189.2, 189.17
See application file for complete search history.

(56) References Cited

U.S. PATENT DOCUMENTS

| | | | |
|---|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |

(Continued)

FOREIGN PATENT DOCUMENTS
EP 0783754 B1 7/1997
(Continued)

OTHER PUBLICATIONS

U.S. Appl. No. 12/019,011 Official Action dated Nov. 20, 2009.

(Continued)

*Primary Examiner* — Pho M Luu
*Assistant Examiner* — Thao Bui
(74) *Attorney, Agent, or Firm* — D. Kligler IP Services Ltd.

(57) ABSTRACT

A method for data storage in a non-volatile memory includes storing data in the non-volatile memory using a first storage configuration while the non-volatile memory is supplied with electrical power. After storing the data, an indication is accepted, indicating that shut-off of the electrical power is imminent. Responsively to the indication and before the shut-off, at least some of the data is re-programmed in the non-volatile memory using a second storage configuration.

34 Claims, 3 Drawing Sheets

U.S. PATENT DOCUMENTS

| | | | |
|---|---|---|---|
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotra et al. | |
| 5,182,558 A | 1/1993 | Mayo | |
| 5,182,752 A | 1/1993 | DeRoo et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,446,854 A | 8/1995 | Khalidi et al. | |
| 5,450,424 A | 9/1995 | Okugaki et al. | |
| 5,469,444 A | 11/1995 | Endoh et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,541,886 A | 7/1996 | Hasbun | |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | De Koening | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,798,966 A | 8/1998 | Keeney | |
| 5,799,200 A * | 8/1998 | Brant et al. | 713/340 |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,428 A | 2/1999 | Ishii et al. | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,946,716 A | 8/1999 | Karp et al. | |
| 5,969,986 A | 10/1999 | Wong et al. | |
| 5,982,668 A | 11/1999 | Ishii et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,009,016 A | 12/1999 | Ishii et al. | |
| 6,023,425 A | 2/2000 | Ishii et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,151,246 A | 11/2000 | So et al. | |
| 6,157,573 A | 12/2000 | Ishii et al. | |
| 6,166,962 A | 12/2000 | Chen et al. | |
| 6,169,691 B1 | 1/2001 | Pasotti et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,259,627 B1 | 7/2001 | Wong | |
| 6,275,419 B1 | 8/2001 | Guterman et al. | |
| 6,278,632 B1 | 8/2001 | Chevallier | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,385,092 B1 | 5/2002 | Ishii et al. | |
| 6,392,932 B1 | 5/2002 | Ishii et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,405,342 B1 | 6/2002 | Lee | |
| 6,418,060 B1 | 7/2002 | Yong et al. | |
| 6,442,585 B1 | 8/2002 | Dean et al. | |
| 6,445,602 B1 | 9/2002 | Kokudo et al. | |
| 6,452,838 B1 | 9/2002 | Ishii et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,490,236 B1 | 12/2002 | Fukuda et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,549,464 B2 | 4/2003 | Tanaka et al. | |
| 6,553,510 B1 | 4/2003 | Pekny et al. | |
| 6,558,967 B1 | 5/2003 | Wong | |
| 6,560,152 B1 | 5/2003 | Cernea | |
| 6,567,311 B2 | 5/2003 | Ishii et al. | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzales et al. | |
| 6,640,326 B1 | 10/2003 | Buckingham et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,683,811 B2 | 1/2004 | Ishii et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,804,805 B2 | 10/2004 | Rub | |
| 6,807,095 B2 | 10/2004 | Chen et al. | |
| 6,807,101 B2 | 10/2004 | Ooishi et al. | |
| 6,809,964 B2 | 10/2004 | Moschopoulos et al. | |
| 6,819,592 B2 | 11/2004 | Noguchi et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,851,081 B2 | 2/2005 | Yamamoto | |

| Patent | Type | Date | Inventor |
|---|---|---|---|
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,870,773 | B2 | 3/2005 | Noguchi et al. |
| 6,873,552 | B2 | 3/2005 | Ishii et al. |
| 6,879,520 | B2 | 4/2005 | Hosono et al. |
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 | 2/2006 | Noguchi et al. |
| 7,012,835 | B2 | 3/2006 | Gonzales et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,145,805 | B2 | 12/2006 | Ishii et al. |
| 7,151,692 | B2 | 12/2006 | Wu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,184,338 | B2 | 2/2007 | Nakagawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzana |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhlesi et al. |
| 7,310,347 | B2 | 12/2007 | Lasser |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 | 8/2008 | Baker et al. |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobetz et al. |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,471,581 | B2 | 12/2008 | Tran et al. |
| 7,483,319 | B2 | 1/2009 | Brown |
| 7,487,329 | B2 | 2/2009 | Hepkin et al. |
| 7,492,641 | B2 | 2/2009 | Hosono et al. |
| 7,508,710 | B2 | 3/2009 | Mokhlesi |
| 7,526,711 | B2 | 4/2009 | Orio |
| 7,539,061 | B2 | 5/2009 | Lee |
| 7,539,062 | B2 | 5/2009 | Doyle |
| 7,551,492 | B2 | 6/2009 | Kim |
| 7,558,109 | B2 | 7/2009 | Brandman et al. |
| 7,558,839 | B1 | 7/2009 | McGovern |
| 7,568,135 | B2 | 7/2009 | Cornwell et al. |
| 7,570,520 | B2 | 8/2009 | Kamei et al. |
| 7,590,002 | B2 | 9/2009 | Mokhlesi et al. |
| 7,593,259 | B2 | 9/2009 | Kim et al. |
| 7,594,093 | B1 | 9/2009 | Kancherla |
| 7,596,707 | B1 | 9/2009 | Vemula |
| 7,609,787 | B2 | 10/2009 | Jahan et al. |
| 7,613,043 | B2 | 11/2009 | Cornwell et al. |
| 7,616,498 | B2 | 11/2009 | Mokhlesi et al. |
| 7,619,918 | B2 | 11/2009 | Aritome |
| 7,631,245 | B2 | 12/2009 | Lasser |
| 7,633,798 | B2 | 12/2009 | Sarin et al. |
| 7,633,802 | B2 | 12/2009 | Mokhlesi |
| 7,639,532 | B2 | 12/2009 | Roohparvar et al. |
| 7,644,347 | B2 | 1/2010 | Alexander et al. |
| 7,656,734 | B2 | 2/2010 | Thorp et al. |
| 7,660,158 | B2 | 2/2010 | Aritome |
| 7,660,183 | B2 | 2/2010 | Ware et al. |

| | | |
|---|---|---|
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 * | 6/2010 | Walston et al. .......... 365/189.11 |
| 7,742,351 B2 | 6/2010 | Inoue et al. |
| 7,761,624 B2 | 7/2010 | Karamcheti et al. |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,928,497 B2 | 4/2011 | Yaegashi |
| 7,930,515 B2 | 4/2011 | Gupta et al. |
| 7,945,825 B2 | 5/2011 | Cohen et al. |
| 7,978,516 B2 * | 7/2011 | Olbrich et al. .......... 365/185.11 |
| 8,014,094 B1 | 9/2011 | Jin |
| 8,037,380 B2 | 10/2011 | Cagno et al. |
| 8,040,744 B2 | 10/2011 | Gorobets et al. |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 * | 1/2007 | Moshayedi et al. .............. 714/2 |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |

| | | | |
|---|---|---|---|
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1 | 3/2009 | Lee et al. | |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157950 A1 | 6/2009 | Selinger | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0193184 A1 | 7/2009 | Yu et al. | |
| 2009/0199074 A1 | 8/2009 | Sommer et al. | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0228761 A1 | 9/2009 | Perlmutter et al. | |
| 2009/0240872 A1 | 9/2009 | Perlmutter et al. | |
| 2009/0265509 A1 | 10/2009 | Klein | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0082883 A1 | 4/2010 | Chen et al. | |
| 2010/0083247 A1 | 4/2010 | Kanevsky et al. | |
| 2010/0110580 A1 | 5/2010 | Takashima | |
| 2010/0131697 A1 | 5/2010 | Alrod et al. | |
| 2010/0142268 A1 | 6/2010 | Aritome | |
| 2010/0142277 A1 | 6/2010 | Yang et al. | |
| 2010/0169547 A1 | 7/2010 | Ou | |
| 2010/0169743 A1 | 7/2010 | Vogan et al. | |
| 2010/0174847 A1 | 7/2010 | Paley et al. | |
| 2011/0066793 A1 | 3/2011 | Burd | |
| 2011/0075482 A1 | 3/2011 | Shepard et al. | |
| 2011/0107049 A1 | 5/2011 | Kwon et al. | |
| 2011/0199823 A1 | 8/2011 | Bar-Or et al. | |
| 2011/0302354 A1 | 12/2011 | Miller | |

FOREIGN PATENT DOCUMENTS

| | | | |
|---|---|---|---|
| EP | 1434236 B1 | 6/2004 | |
| EP | 1605509 A1 | 12/2005 | |
| WO | 9610256 A1 | 4/1996 | |
| WO | 9828745 A1 | 7/1998 | |
| WO | 02100112 A1 | 12/2002 | |
| WO | 03100791 A1 | 12/2003 | |
| WO | 2007046084 A2 | 4/2007 | |
| WO | 2007132452 A2 | 11/2007 | |
| WO | 2007132453 A2 | 11/2007 | |
| WO | 2007132456 A2 | 11/2007 | |
| WO | 2007132457 A2 | 11/2007 | |
| WO | 2007132458 A2 | 11/2007 | |
| WO | 2007146010 A2 | 12/2007 | |
| WO | 2008026203 A2 | 3/2008 | |
| WO | 2008053472 A2 | 5/2008 | |
| WO | 2008053473 A2 | 5/2008 | |
| WO | 2008068747 A2 | 6/2008 | |
| WO | 2008077284 A1 | 7/2008 | |
| WO | 2008083131 A2 | 7/2008 | |
| WO | 2008099958 A1 | 8/2008 | |
| WO | 2008111058 A2 | 9/2008 | |
| WO | 2008124760 A2 | 10/2008 | |
| WO | 2008139441 A2 | 11/2008 | |
| WO | 2009037691 A2 | 3/2009 | |
| WO | 2009037697 A2 | 3/2009 | |
| WO | 2009038961 A2 | 3/2009 | |
| WO | 2009050703 A2 | 4/2009 | |
| WO | 2009053961 A2 | 4/2009 | |
| WO | 2009053962 A2 | 4/2009 | |
| WO | 2009053963 A2 | 4/2009 | |
| WO | 2009063450 A2 | 5/2009 | |
| WO | 2009072100 A2 | 6/2009 | |
| WO | 2009072101 A2 | 6/2009 | |
| WO | 2009072102 A2 | 6/2009 | |
| WO | 2009072103 A2 | 6/2009 | |
| WO | 2009072104 A2 | 6/2009 | |
| WO | 2009072105 A2 | 6/2009 | |
| WO | 2009074978 A2 | 6/2009 | |
| WO | 2009074979 A2 | 6/2009 | |
| WO | 2009078006 A2 | 6/2009 | |
| WO | 2009095902 A2 | 8/2009 | |
| WO | 2011024015 A1 | 3/2011 | |

OTHER PUBLICATIONS

Takeuchi et al., "A Multipage Cell Architecture for High-Speed Programming Multilevel NAND Flash Memories", IEEE Journal of Solid State Circuits, vol. 33, No. 8, Aug. 1998.

JEDEC Standard JESD84-C44, "Embedded MultiMediaCard (e•MMC) Mechanical Standard, with Optional Reset Signal", JEDEC Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

U.S. Appl. No. 12/344,233 Official Action dated Jun. 24, 2011.

U.S. Appl. No. 11/995,813 Official Action dated Jun. 16, 2011.

U.S. Appl. No. 12/178,318 Official Action dated May 31, 2011.

CN Patent Application # 200780026181.3 Official Action dated Apr. 8, 2011.

U.S. Appl. No. 12/880,101 "Reuse of Host Hibernation Storage Space by Memory Controller", filed Sep. 12, 2010.

U.S. Appl. No. 12/890,724 "Error Correction Coding Over Multiple Memory Pages", filed Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

Numonyx, "M25PE16: 16-Mbit, page-erasable serial flash memory with byte-alterability, 75 MHz SPI bus, standard pinout", Apr. 2008.

U.S. Appl. No. 11/995,814 Official Action dated Dec. 17, 2010.

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

Ubuntu Forums, "Memory Stick Failed IO Superblock", posted Nov. 11, 2009.

Super User Forums, "SD Card Failure, can't read superblock", posted Aug. 8, 2010.

U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference , New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.
ONFI, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.

International Application PCT/IL2008/001446 Search report dated Feb. 20, 2009.
U.S. Appl. No. 11/949,135 Official Action dated Oct. 2, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
Sommer et al., U.S. Appl. No. 12/497,707 "Data Storage in Analog Memory Cells with Protection Against Programming Interruption" filed Jul. 6, 2009.
Winter et al., U.S. Appl. No. 12/534,898 "Data Storage Using Modified Voltages" filed Aug 4, 2009.
Winter et al., U.S. Appl. No. 12/534,893 "Improved Data Storage in Analog Memory Cells Using Modified Pass Voltages" filed Aug 4, 2009.
Shalvi et al., U.S. Appl. No. 12/551,583 "Segmented Data Storage" filed Sep 1, 2009.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed on Oct. 30, 2011.
U.S. Appl. No. 13/284,913, filed on Oct. 30, 2011.
U.S. Appl. No. 13/338,335, filed on Dec. 28, 2011.
U.S. Appl. No. 13/355,536, filed on Jan. 22, 2012.
US 7,161,836, 01/2007, Wan et al. (withdrawn)

* cited by examiner

RELIABLE DATA STORAGE IN ANALOG MEMORY CELLS SUBJECTED TO LONG RETENTION PERIODS

CROSS-REFERENCE TO RELATED APPLICATIONS

This application claims the benefit of U.S. Provisional Patent Application 61/093,613, filed Sep. 2, 2008, U.S. Provisional Patent Application 61/096,808, filed Sep. 14, 2008, U.S. Provisional Patent Application 61/105,819, filed Oct. 16, 2008, U.S. Provisional Patent Application 61/120,968, filed Dec. 9, 2008, and U.S. Provisional Patent Application 61/141,866, filed Dec. 31, 2008, whose disclosures are incorporated herein by reference.

FIELD OF THE INVENTION

The present invention relates generally to memory devices, and particularly to methods and systems for data storage in analog memory cells that experience retention periods.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume either of two possible programming levels. Higher-density devices, often referred to as Multi-Level Cell (MLC) devices, store two or more bits per memory cell, i.e., can be programmed to assume more than two possible programming levels.

SUMMARY OF THE INVENTION

An embodiment of the present invention provides a method for data storage in a non-volatile memory, the method including:

while the non-volatile memory is supplied with electrical power, storing data in the non-volatile memory using a first storage configuration;

after storing the data, accepting an indication that shut-off of the electrical power is imminent; and responsively to the indication and before the shut-off, re-programming at least some of the data in the non-volatile memory using a second storage configuration.

In some embodiments, the first storage configuration has a first data retention period, and the second storage configuration has a second data retention period, longer than the first data retention period. In an embodiment, the electrical power is supplied from a host system, and accepting the indication includes receiving from the host system a notification that the shut-off is imminent. In another embodiment, the non-volatile memory is included in a storage device, which is removably connected to a host system and which receives the electrical power from the host system, and the shut-off is caused by removal of the storage device from the host system. The storage device may include a Solid-State Disk (SSD).

In a disclosed embodiment, the non-volatile memory includes a plurality of analog memory cells, storing the data using the first storage configuration includes programming a first group of the analog memory cells using a first number of programming states, and re-programming the at least some of the data includes programming a second group of the memory cells using a second number of the programming states, which is less than the first number. In another embodiment, storing the data using the first storage configuration includes encoding the stored data using a first Error Correction Code (ECC) having a first error correction capability, and re-programming the at least some of the data includes encoding the at least some of the data using a second Error Correction Code (ECC) having a second error correction capability, which is higher than the first error correction capability.

In yet another embodiment, the non-volatile memory includes a plurality of analog memory cells, storing the data using the first storage configuration includes programming a first group of the memory cells using a first sequence of programming pulses having a first programming step size, and re-programming the at least some of the data includes programming a second group of the memory cells using a second sequence of the programming pulses having a second programming step size, which is smaller than the first programming step size. In still another embodiment, storing the data using the first storage configuration includes pre-equalizing the stored data using a first pre-equalization scheme having a first interference cancellation level, and re-programming the at least some of the data includes pre-equalizing the at least some of the data using a second pre-equalization scheme having a second interference cancellation level, which is better than the first interference cancellation level. Storing the data using the first storage configuration may include refraining from pre-equalizing the stored data.

In some embodiments, the non-volatile memory includes a plurality of analog memory cells, storing the data using the first storage configuration includes programming a first group of the memory cells using one or more first voltages, and re-programming the at least some of the data includes programming a second group of the memory cells using one or more second voltages, at least one of which is higher than a respective first voltage. The voltages may include at least one voltage type selected from a group of types consisting of programming voltages and pass voltages. In an embodiment, the non-volatile memory includes a plurality of analog memory cells, storing the data using the first storage configuration includes programming a first group of the analog memory cells using first programming states that occupy a first range, and re-programming the at least some of the data includes programming a second group of the memory cells using second programming states that occupy a second range, which is wider than the first range.

In some embodiments, responsively to determining that the electrical power has been restored following the shut-off, the re-programmed data is restored in the non-volatile memory from the second storage configuration to the first storage configuration. In an embodiment, restoring the re-programmed data includes reading the re-programmed data using a first read operation having a first reading accuracy, which is higher than a second reading accuracy of a second read operation used for reading the data stored using the first storage configuration.

In an embodiment, the non-volatile memory includes a plurality of analog memory cells, and reading the re-programmed data includes reading the memory cells using a first number of read thresholds, which is higher than a second number of the read thresholds used in the second read operation. In another embodiment, reading the re-programmed data includes applying to the re-programmed data a first signal processing scheme having a first performance level, which is higher than a second performance level of a second signal processing scheme used in the second read operation. Applying the first signal processing scheme may include applying a first ECC decoding scheme having a first error correction capability, which is higher than a second error correction capability of a second ECC decoding scheme used in the second read operation. Additionally or alternatively, applying the first signal processing scheme may include applying a first interference cancellation scheme having a first interference cancellation level, which is higher than a second interference cancellation level of a second interference cancellation scheme used in the second read operation.

In some embodiments, the second read operation operates on hard decoding metrics computed for the stored data, and reading the re-programmed data includes computing soft decoding metrics from the re-programmed data and decoding the re-programmed data using the soft decoding metrics. In an embodiment, the non-volatile memory includes a plurality of analog memory cells, and reading the re-programmed data includes reading the memory cells using one or more first read voltages, at least one of which is higher than a respective second read voltage used in the second read operation. In another embodiment, the non-volatile memory includes a plurality of analog memory cells, and reading the re-programmed data includes re-reading the memory cells a first number of times, which is larger than a second number of times the memory cells are read in the second read operation.

In a disclosed embodiment, the method includes storing known data in a part of the non-volatile memory before the shut-off, and assessing an impact of the shut-off on the re-programmed data by reading the part of the non-volatile memory after the electrical power has been restored. In another embodiment, the method includes outputting a notification, which indicates that access speed to the non-volatile memory is temporarily degraded during a time period in which the re-programmed data is restored from the second storage configuration to the first storage configuration. In some embodiments, accepting the indication includes sensing a loss of the electrical power. In an embodiment, re-programming the at least some of the data includes switching to a temporary power source responsively to the indication, and re-programming the at least some of the data while drawing energy from the temporary power source.

In some embodiments, the non-volatile memory is partitioned into a normal storage area and an over-provisioning storage area, and re-programming the at least some of the data includes storing a first part of the re-programmed data in the normal storage area, and a second part of the re-programmed data in the over-provisioning storage area. In an embodiment, the method includes making an attempt to recover the re-programmed data using only the first part, and, responsively to a failure of the attempt, recovering the re-programmed data using both the first and the second parts. In a disclosed embodiment, the non-volatile memory includes a plurality of analog memory cells, and the method includes identifying a group of the memory cells that are expected to distort the re-programmed data during the shut-off, storing information related to the identified memory cells, and recovering the data re-programmed in the identified memory cells using the stored information.

There is additionally provided, in accordance with an embodiment of the present invention, a method for data storage in a non-volatile memory, the method including:

while the non-volatile memory is supplied with electrical power, storing data in the non-volatile memory twice, using different first and second storage configurations;

in a normal operational mode, reading the data that was stored using the first storage configuration; and following a shut-off of the electrical power, reading the data that was stored using the second storage configuration.

There is also provided, in accordance with an embodiment of the present invention, a method for operating a host system that includes a Dynamic Random Access Memory (DRAM), the method including:

while the host system is operating in a normal mode, storing data in the DRAM using a first storage configuration having a first data retention period, and applying refreshing operations to the data at a first frequency;

after storing the data, accepting an indication that the host system is to switch to a standby mode;

responsively to the indication, re-programming the data in the DRAM using a second storage configuration having a second data retention period, longer than the first data retention period, and applying the refreshing operations to the re-programmed data at a second frequency, lower than the first frequency.

There is further provided, in accordance with an embodiment of the present invention, apparatus for data storage, including:

an interface, which is coupled to communicate with a non-volatile memory; and circuitry, which is coupled to store data in the non-volatile memory using a first storage configuration while the non-volatile memory is supplied with electrical power, to accept, after storing the data, an indication that shut-off of the electrical power is imminent, and, responsively to the indication and before the shut-off, to re-program at least some of the data in the non-volatile memory using a second storage configuration.

There is additionally provided, in accordance with an embodiment of the present invention, apparatus for data storage, including:

an interface, which is coupled to communicate with a non-volatile memory; and circuitry, which is coupled to store data in the non-volatile memory twice while the non-volatile memory is supplied with electrical power, using different first and second storage configurations, to read, in a normal operational mode, the data that was stored using the first storage configuration, and, following a shut-off of the electrical power, to read the data that was stored using the second storage configuration.

There is also provided, in accordance with an embodiment of the present invention, a data storage apparatus, including:

a Dynamic Random Access Memory (DRAM); and circuitry, which is coupled to store data in the DRAM using a first storage configuration having a first data retention period and to apply refreshing operations to the data at a first frequency while a host system comprising the DRAM is operating in a normal mode, to accept, after storing the data, an indication that the host system is to switch to a standby mode, and, responsively to the indication, to re-program the data in the DRAM using a second storage configuration having a second data retention period that is longer than the first data retention period and to apply the refreshing operations to the re-programmed data at a second frequency, lower than the first frequency.

The present invention will be more fully understood from the following detailed description of the embodiments thereof, taken together with the drawings in which:

DETAILED DESCRIPTION OF EMBODIMENTS

Overview

In many data storage applications, non-volatile memory devices may be disconnected from electrical power for long periods of time. Power shut-offs are common, for example, in removable storage devices that accept electrical power from a host, such as Solid-State Disk (SSD) systems, Disk-On-Keys (DOK) and removable memory cards. A device of this sort experiences power shut-off whenever it is disconnected from the host.

Power shut-off periods have a detrimental effect on the storage reliability of analog memory cells. Typically, the charge level or other storage value of an analog memory cell drifts over time, starting from the moment the cell is programmed. When a given memory cell is programmed to a certain programming state, its storage value may drift over time into a range of values that is associated with another programming state, thus causing read errors. During power shut-off periods, it is usually impossible to identify drifts and take appropriate measures. As a result, memory cell storage values may undergo considerable distortion by the time electrical power is restored, and this distortion may cause significant performance degradation.

Embodiments of the present invention that are described hereinbelow provide methods and systems for maintaining the reliability of data stored in analog memory cells that are subject to power shut-off periods. These methods and systems take preparatory steps when power shut-off is imminent, typically by re-programming the data in a manner that is less sensitive to drift-related distortion.

In some embodiments, a memory system comprises a non-volatile memory and a processor. While the memory system is supplied with electrical power, the processor stores data in the memory using a certain storage configuration (e.g., a certain number of memory states per cell and/or a certain error correction code). When the processor accepts an indication that electrical power shut-off is imminent, it re-programs at least some of the data in the memory. The storage configuration used for re-programming is typically more robust to storage value drifts, e.g., has a smaller number of programming states and/or a lower-rate error correction code in comparison with the storage configuration used for normal storage.

Several examples of robust storage configurations are described herein. Although these storage configurations are highly resilient against drift-related distortion, they may degrade other performance figures such as memory access speed and cell wearing. Since power shut-offs are relatively rare, however, the degradation is usually tolerable. When electrical power is restored, the processor typically reads the re-programmed data, and converts it from the robust storage configuration back into the normal storage configuration.

In summary, the methods and systems described herein enable non-volatile memory systems to endure long power shut-off periods with little or no effect on data reliability.

System Description

Figure 1:
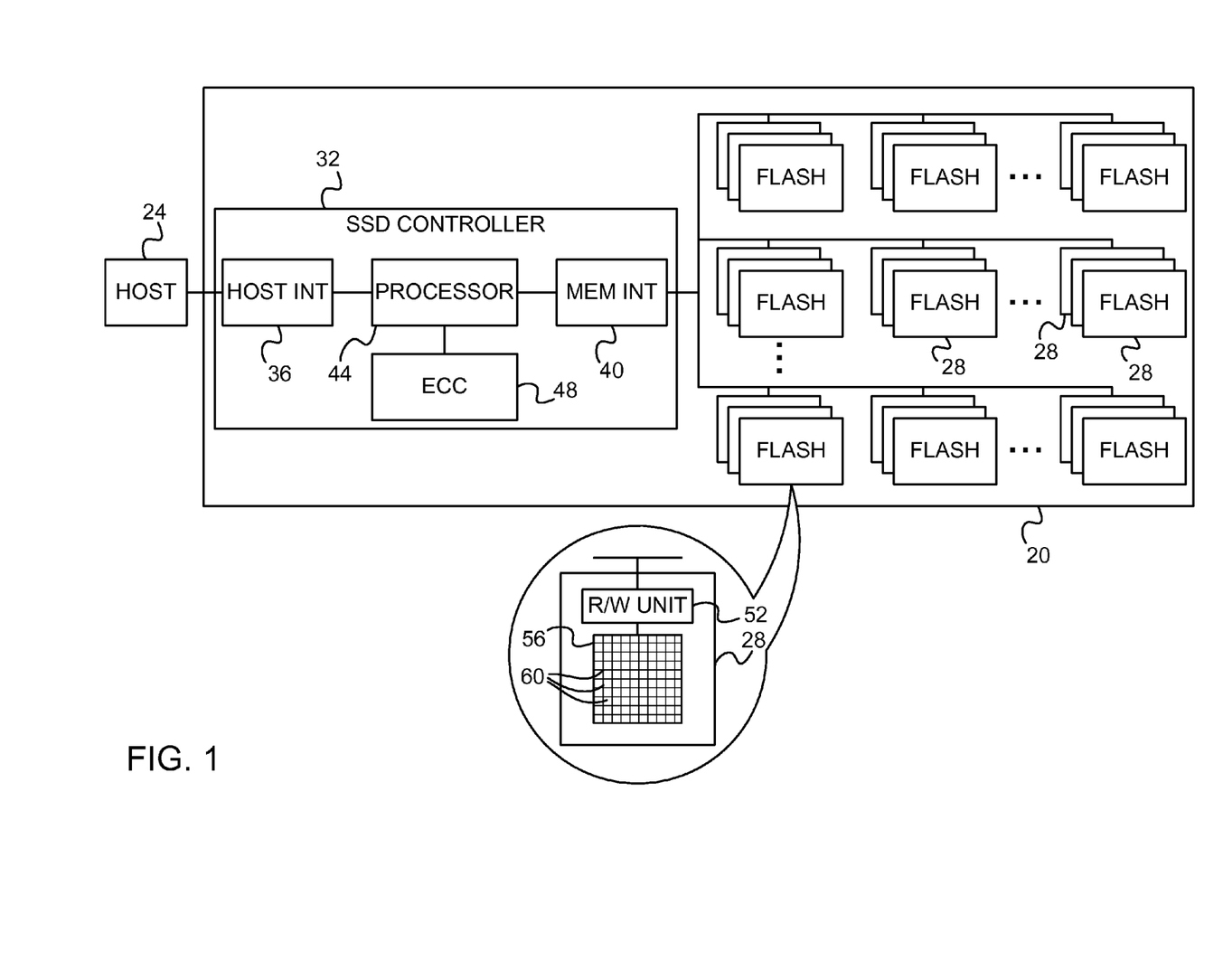
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 accepts data for storage from a host 24 and stores it in memory, and retrieves data from memory and provides it to the host. In the present example, system 20 comprises a Solid-State Disk (SSD) that stores data for a host computer. In alternative embodiments, however, system 20 may be used in any other suitable application and with any other suitable host, such as in computing devices, cellular phones or other communication terminals, removable memory modules such as Disk-On-Key (DOK) devices, Secure Digital (SD) cards, Multi-Media Cards (MMC) and embedded MMC (eMMC), digital cameras, music and other media players and/or any other system or device in which data is stored and retrieved.

System 20 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells, can also be used. Each memory device may comprise a packaged device or an unpackaged semiconductor chip or die. A typical SSD may comprise several devices, each providing a storage space of 4 GB. Generally, however, system 20 may comprise any suitable number of memory devices of any desired type and size. Although the system configuration of FIG. 1 comprises multiple memory devices, the methods and systems described herein can also be used in systems having only a single memory device.

System 20 comprises an SSD controller 32, which accepts data from host 24 and stores it in memory devices 28, and retrieves data from the memory devices and provides it to the host. SSD controller 32 comprises a host interface 36 for communicating with host 24, a memory interface 40 for communicating with memory devices 28, and a processor 44 that processes the stored and retrieved data. In some embodiments, controller 32 encodes the stored data with an Error Correction Code (ECC). In these embodiments, controller 32 comprises an ECC unit 48, which encodes the data before stored in devices 28 and decodes the ECC of data retrieved from devices 28.

Each memory device 28 comprises a memory cell array 56. The memory array comprises multiple analog memory cells 60. In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 28 comprises a non-volatile memory of NAND Flash cells.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Each memory device 28 comprises a reading/writing (R/W) unit 52, which accepts data for storage from SSD controller 32, converts the data into analog storage values and writes them into memory cells 60 of that memory device. In alternative embodiments, the R/W unit does not perform the conversion, but is provided with voltage samples, i.e., with the storage values for storage in the cells. When reading data out of array 56, R/W unit 52 typically converts the storage values of memory cells 60 into digital samples having a resolution of one or more bits, and provides the digital samples to controller 32. Data is typically written to and read from the memory cells in groups that are referred to as pages. In some embodiments, the R/W unit can erase a group of cells 60 by applying one or more negative erasure pulses to the cells.

SSD controller 32, and in particular processor 44, may be implemented in hardware. Alternatively, the SSD controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and SSD controller 32 are implemented as separate Integrated Circuits (ICs). In alternative embodiments, however, the memory devices and the SSD controller may be integrated on separate semiconductor dies in a single Multi-Chip Package (MCP) or System on Chip (SoC), and may be interconnected by an internal bus. Further alternatively, some or all of the SSD controller circuitry may reside on the same die on which one or more of the memory devices are disposed. Further alternatively, some or all of the functionality of SSD controller 32 can be implemented in software and carried out by a processor or other element of the host system, or by any other type of memory controller. In some embodiments, host 24 and SSD controller 32 may be fabricated on the same die, or on separate dies in the same device package.

In an example configuration, memory cells 60 in a given array 56 are arranged in multiple rows and columns. The memory cells in each row are connected by word lines, and the memory cells in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Storage and Retrieval in the Presence of Long Power Shut-Off Periods

In some host systems and applications, system 20 may be disconnected from electrical power for relatively long time periods. For example, system 20 may comprise a removable storage device that accepts its electrical power from the host. Such a storage device can be removed from the host and remain without electrical power for long periods of time. This sort of scenario is common, for example, in SSD applications as well as in DOK, SD and MMC devices. Alternatively, system 20 may experience power shut-off periods for any other reason.

Power shut-off periods often have a detrimental effect on the storage reliability of analog memory cells. Typically, the threshold voltage of an analog memory cell drifts over time, starting from the moment the cell is programmed. These drifts are especially severe when the memory devices' temperature changes considerably. When a given cell is programmed to a certain programming state, its threshold voltage may drift over time into a range of values that is associated with another programming state, thus causing read errors.

Threshold voltage drifts usually occur regardless of whether electrical power is present or not. During power shut-off periods, however, the system is typically unable to identify the drifts and take appropriate measures. As a result, the cells' threshold voltages may undergo considerable distortion by the time electrical power is restored. This distortion may cause significant performance degradation.

In some embodiments, system 20 reduces the effect of power shut-off periods by taking preparatory measures before the electrical power disappears. Typically, SSD controller 32 is able to identify that power shut-off is imminent, e.g., by receiving an indication from host 24. Upon receiving such an indication, the SSD controller re-programs ("refreshes") at least some of the data in memory devices 28. The re-programming operation causes the retention period to begin as closely as possible to the beginning of the power shut-off period. In other words, the memory cells begin the shut-off period as fresh as possible. In addition, when re-programming the data, the SSD controller typically uses a storage configuration that is less sensitive to errors caused by retention periods, in comparison with the storage configuration used for normal programming.

The term "storage configuration" is used in a broad sense and refers to any parameter or process that is used by SSD controller 32 and/or R/W units 52 in storing data in memory devices 28. Several examples of storage configurations are described further below. Each storage configuration can be characterized by a respective data retention period (referred to as "retention period" for brevity). The retention period of a given storage configuration is defined as the maximal time period in which data, which was stored in the memory using the given storage configuration, can be retrieved from the memory at a predefined reliability level.

The robust storage configuration, which is used for refreshing the data in preparation for power shut-off, may differ from the normal storage configuration in various parameters and processes. For example, system 20 may re-program the data with a lower number of programming levels per cell. Reducing the number of programming levels enables increasing the separation (the difference in threshold voltage) between adjacent programming levels. As a result, higher drifts can be tolerated before read errors begin to occur.

As another example, system 20 may re-program the data with an ECC, which has a higher error correction capability that the ECC used for normal storage. Using a stronger ECC (usually a lower-rate ECC) enables correcting errors that may be caused by retention-related threshold voltage drifts, and the retention period is extended accordingly.

In some embodiments, each R/W unit 52 programs memory cells 60 using an iterative Programming and Verification (P&V) process. In such a process, the R/W unit applies a sequence of programming pulses to a group of memory cells. The threshold values of the cells are read (verified) after each iteration, and programming continues only for those cells that have not yet reached their intended programming levels. The incremental increase in cell threshold voltage after each programming pulse is often referred to as a programming step size, and usually depends on the amplitudes and/or durations of the programming pulses. Using a small programming step size reduces the variance of the cells' threshold voltages after programming, and therefore increases the retention period. Thus, system 20 may define the robust storage configuration as having a smaller programming step size in comparison to the step size used for normal programming.

Additionally or alternatively, system 20 may vary the voltages used for programming between the robust and normal storage configurations. For example, the system may re-program the memory cells using a larger overall range of threshold voltages (i.e., a higher maximum threshold voltage). In particular, when using an extended threshold voltage range, the system may modify the threshold voltages that represent the different programming levels so as to increase the separation between adjacent programming levels. Consequently, the retention period is increased.

In some memory devices, the analog memory cells are arranged in strings. Each string comprises a group of floating-gate memory cells that are connected source-to-drain in series with one another. This sort of configuration is common, for example, in NAND Flash devices. A particular target memory cell can be read by (1) applying a read voltage to the target cell's gate, (2) applying a "pass voltage" to the other memory cells in the string, and (3) measuring the electrical conductance of the string. The pass voltage is usually selected to be sufficiently high so that the unselected memory cells in the string will conduct regardless of their charge levels. The read voltage, on the other hand, is typically chosen so that the conductance of the target cell will depend on its charge level.

In some embodiments, system 20 defines the robust storage configuration as having a higher pass voltage in comparison with that of the normal storage configuration. When different pass voltages are applied to different unselected cells, at least one pass voltage in the robust storage configuration is higher than the respective pass voltage in the normal storage configuration.

As yet another example, system 20 may apply a certain interference cancellation scheme when re-programming the data using the robust storage configuration, and refrain from applying this scheme (or use a simpler, lower-performance scheme) when using the normal storage configuration. For example, system 20 may pre-equalize the storage values to be written into the memory cells, in order to cancel cross-coupling interference from neighbor cells. In some embodiments, system 20 may apply pre-equalization when using the robust storage configuration and refrain from applying pre-equalization (or apply a simpler, lower-performance pre-equalization scheme) when using the normal storage configuration.

In some embodiments, the robust storage configuration may differ from the normal storage configuration in two or more parameters or processes. For example, system 20 may use a certain number of programming levels and a certain ECC in the normal storage configuration, and a smaller number of programming levels and a stronger ECC in the robust storage configuration. Further alternatively, the robust storage configuration may differ from the normal storage configuration in any other suitable parameter or process. The different features of the robust and normal storage configurations may be applied by the SSD controller, by the R/W units, or both.

In some embodiments, the data stored in a given memory device is re-programmed into the same memory device, e.g., to a different block. Generally, however, data can be re-programmed into any suitable location in any of devices 28. In some embodiments, some of the data remains unchanged during the re-programming operation. For example, the SSD controller may re-program data with a lower-rate ECC by adding redundancy bits while preserving the original data bits. The newly-added redundancy bits can be stored in unused pages, either in the same memory device as the data bits or in a different memory device.

On one hand, the robust storage configuration has a longer retention period in comparison with the normal storage configuration. On the other hand, however, the longer retention period may come at the expense of other performance figures. For example, using a smaller number of programming levels per cell reduces the storage density. As such, the number of memory cells needed to store a given data volume using the robust storage configuration is larger. Using a stronger ECC also increases the number of cells needed to store a given data volume, since a stronger ECC usually produces a higher number of redundancy bits. Other possible features of the robust storage configuration, e.g., smaller programming step size or complex interference cancellation scheme, may reduce programming speed. Using higher programming voltages may increase cell wearing. Since power shut-off events are relatively rare, system 20 can usually tolerate this performance degradation.

Typically, system 20 refreshes the data again when electrical power is restored. Re-programming the data when electrical power resumes terminates the retention period and causes the memory cells to be fresh again. In some embodiments, when refreshing the data at the end of a power shut-off period, system 20 reverts back to the normal storage configuration. This technique limits the performance degradation to occur only in a short interval preceding power shut-off. In some embodiments, the read operation carried out as part of this refreshing operation is optimized for higher accuracy, in comparison with normal data readout operations. The higher-accuracy read operation may differ from the normal read operation in any suitable parameter or process.

System 20 may perform high-accuracy reading in various ways. For example, the high-accuracy read operation may use a larger number of read thresholds (i.e., read the cells at a higher resolution) in comparison with the normal read operation. Additionally or alternatively, the high-accuracy read operation may apply higher-complexity signal processing schemes in comparison with the normal read operation. For example, high-accuracy reading may apply an interference cancellation process that that considers a larger number of neighbor cells than the normal read operation. (In particular, the normal read operation may not apply interference cancellation at all.)

Additionally or alternatively, the high-accuracy read operation may apply a stronger ECC decoding scheme than the normal read operation. For example, the ECC decoding scheme in the high-accuracy read operation may operate on soft metrics, whereas the ECC decoding scheme in the normal read operation may operate on hard metrics. As another example, the ECC decoding scheme in the high-accuracy read operation may have a higher computational complexity (or be allocated more processing time) than that of the normal read operation. As yet another example, the normal read operation may decode the ECC using a partial subset of the redundancy bits, whereas the high-accuracy read operation may decode the ECC using a larger number of the redundancy bits (often all the redundancy bits).

The examples given above assume that both high-accuracy and normal read operations operate on the same code. In some embodiments, however, the ECC used for re-programming the data before power shut-off is stronger than the ECC used for normal storage. In these embodiments, the high-accuracy read operation may apply a different (and stronger) ECC decoding scheme, because it operates on a stronger ECC than the normal read operation.

Further additionally or alternatively, the high-accuracy read operation may use higher pass voltages and/or read voltages in comparison with the normal read operation. The high-accuracy read operation may re-read the cells multiple times to reduce read noise, whereas the normal read operation may re-read the cells a fewer number of times (e.g., only once). Further additionally or alternatively, the high-accuracy read operation may differ from the normal read operation in any other suitable feature. The high-accuracy reading operation often comes at the expense of other performance figures, such as reading speed or cell wearing. Nevertheless, since power shut-off events are relatively rare, the performance degradation is usually tolerable.

Figure 2:
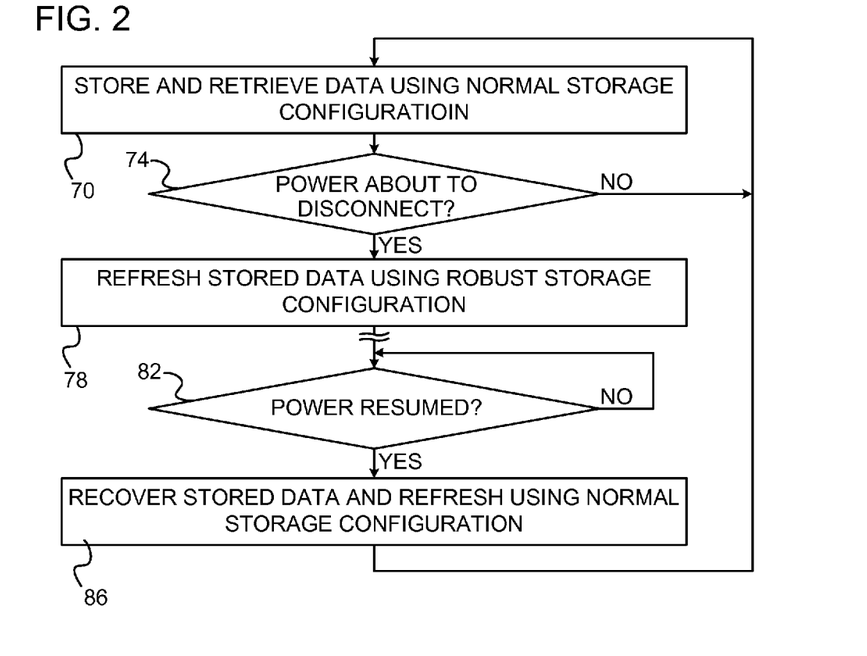
FIG. 2 is a flow chart that schematically illustrates a method for data storage in analog memory cells that experience power shut-off periods, in accordance with an embodiment of the present invention.

FIG. 2 is a flow chart that schematically illustrates a method for data storage in analog memory cells that experience power shut-off periods, in accordance with an embodiment of the present invention. The method begins with system 20 storing and retrieving data in non-volatile memory devices 28 using the normal storage configuration, at a normal storage step 70. At this stage, system 20 is supplied with electrical power, e.g., via host 24.

SSD controller 32 checks whether electrical power shut-off is imminent, at a shut-off checking step 74. For example, the SSD controller and the host may support an interface, via which the host notifies the SSD controller of up-coming power shut-offs in order to allow system 20 to take appropriate preparatory measures. The SSD controller may check whether such a notification is received from the host.

If no power shut-off is imminent, the method loops back to step 70 above, and system 20 continues to store and retrieve data using the normal storage configuration. If, on the other hand, SSD controller 32 determines that electrical power is about to be shut-off (e.g., in response to a notification from the host), system 20 re-programs at least some of the stored data in devices 28 using the robust storage configuration, at a robust refreshing step 78.

SSD controller 32 checks whether electrical power is resumed, at a power resumption checking step 82. For example, the host may notify the SSD controller that power is resumed, or the SSD controller may sense the presence of electrical power independently of any notification. Upon concluding that electrical power is resumed, system 20 recovers the re-programmed data and refreshes it again using the normal storage configuration, at a normal refreshing step 86. The method then loops back to step 70 above, in which system 20 stores and retrieves data using the normal storage configuration.

In some cases, refreshing the data after power resumes (step 86) is a time-consuming and computationally-intensive task, e.g., because of the robust storage configuration and/or the high-accuracy read operation involved. Nevertheless, it should be noted that the data that was re-programmed before the shut-off (at step 78) can also be read without converting it back to the normal storage configuration. Thus, a request from host 24 to retrieve certain data can be served even if this data has not yet been refreshed by step 86. In some embodiments, step 86 is carried out as a background task that gradually converts data from the robust storage configuration to the normal storage configuration.

In some cases, storage and retrieval in the robust storage configuration involves high processing power and/or considerable hardware resources. Thus, in some embodiments, programming and reading data in the robust storage configuration can be carried out by a separate unit, either part of or separate from the SSD controller. In some embodiments, R/W unit 52 of each memory device 28 comprises dedicated circuitry for storing and retrieving data in the robust storage configuration. Alternatively, data storage and retrieval in the robust storage configuration can be carried out by centralized circuitry in system 20, either internally or separately from SSD controller 32.

Figure 3A:
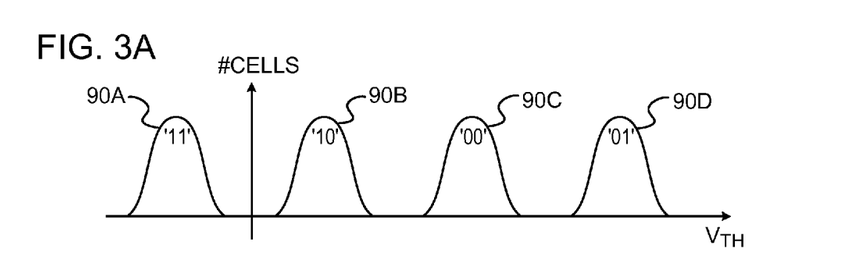
FIGS. 3A and 3B are graphs showing threshold voltage distributions in a group of analog memory cells, in accordance with an embodiment of the present invention.
Figure 3B:
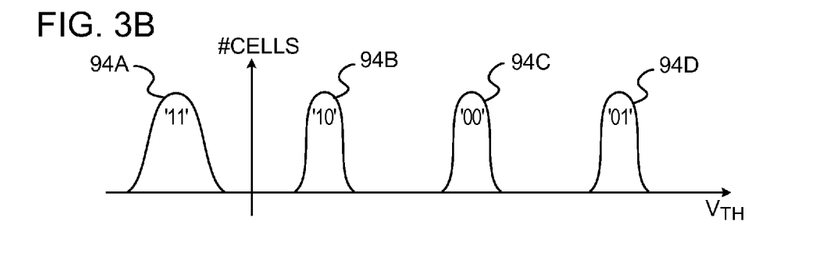

FIGS. 3A and 3B are graphs showing threshold voltage distributions in a group of analog memory cells 60, in accordance with an embodiment of the present invention. These figures demonstrate one example of a normal storage configuration (FIG. 3A) and a robust storage configuration (FIG. 3B). The present example refers to four-level cells, each storing two data bits. When using the normal storage configuration, a group of memory cells are programmed to produce threshold voltage distributions 90A . . . 90D. Distributions 90A . . . 90D show the distribution of threshold voltages in the cells that store "11", "10", "00" and "01" data, respectively. The variance of the distributions is affected by various factors, and in particular by the programming step size (the incremental increase in threshold voltage from one programming pulse to the next, as described above).

FIG. 3B shows threshold voltage distributions 94A . . . 94D in a group of cells that is programmed using the robust storage configuration. In the present example, the robust storage configuration uses a smaller programming step size than the normal storage configuration. As a result, distributions 94A . . . 94D are considerably more compact, i.e., have smaller variances, in comparison with distributions 90A . . . 90D. As can be seen in the figures, the separation between adjacent programming levels in FIG. 3B is considerably larger than in FIG. 3A. Therefore, the storage configuration of FIG. 3B has a considerably longer retention period than the storage configuration of FIG. 3A.

Robust Storage Configuration Using Segmented Storage

As explained above, the robust storage configuration often uses more storage space (a larger number of memory cells) for a given volume of data, in comparison with the normal storage configuration. More storage space is needed, for example, when the robust storage configuration uses a lower-rate ECC that produces a larger number of redundancy bits.

In some configurations of system 20, a certain Over-Provisioning (OP) memory space is allocated in memory devices 28. The OP space is allocated beyond the user-specified size of the memory, and is used by the system for various purposes. For example, when a memory block in a certain memory device 28 fails, the system may replace it with a block drawn from the OP space. Using this technique, system 20 can continue to provide its specified memory size over a long time period, even when memory blocks fail occasionally.

In some embodiments, system 20 uses the OP memory space for storing redundancy bits in the robust storage configuration.

Figure 4:
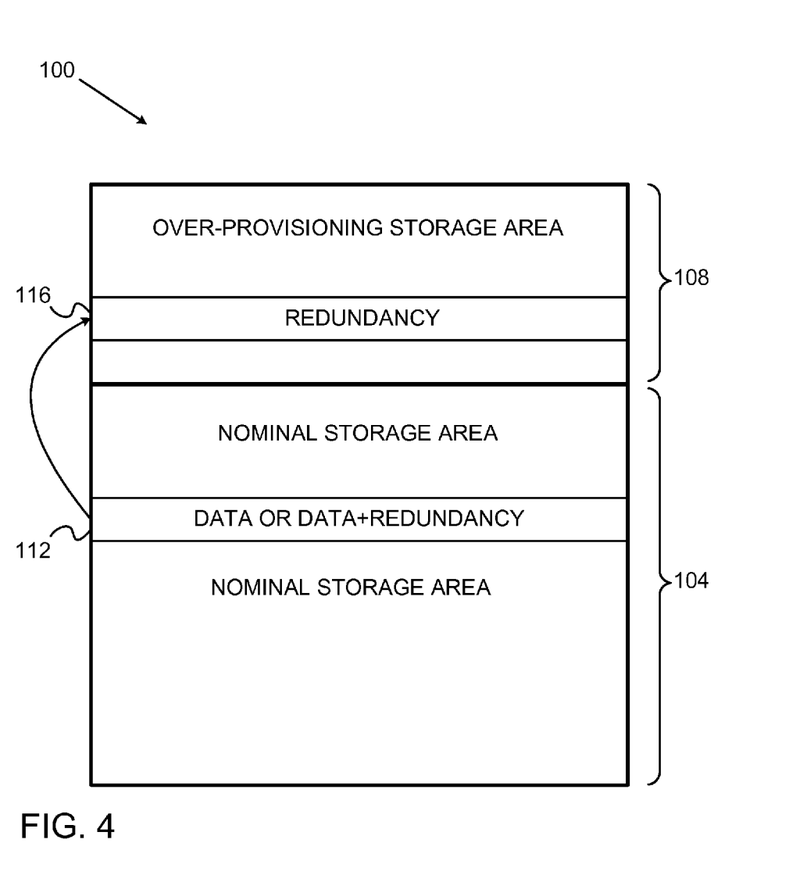
FIG. 4 is a diagram showing a memory array partitioned into nominal and over-provisioning storage areas, in accordance with an embodiment of the present invention.

FIG. 4 is a diagram showing a memory array 100 in one of memory devices 28, which is partitioned into a nominal storage area 104 and an Over-Provisioning (OP) storage area 108, in accordance with an embodiment of the present invention. In a typical SSD application, OP area 108 occupies on the order of 10-40% of the total memory space of array 100, although any other suitable ratio can also be used.

When using the normal storage configuration, system stores data bits, and possibly also ECC redundancy bits, in area 104. In the present example, a data item 112 comprises the data bits and possibly redundancy bits. When re-programming the data in the robust storage configuration, system 20 may use some of the space in OP area 108 for storing additional redundancy bits 108, which are associated with data item 112. When reading the data stored in the robust storage configuration, system 20 reads data element 112 (which comprises data bits and possibly redundancy bits) from nominal area 104, reads redundancy bits 116 from OP area 108, and decodes the ECC based on the read data and redundancy bits.

When redundancy bits are stored both in the nominal area and in the OP area, the system may recover the data in several ways. For example, the system may first attempt to read only the data and redundancy bits stored in the nominal area, and attempt to decode the ECC. If ECC decoding fails, the system may read the additional redundancy bits from the OP area and re-attempt to decode the ECC using the additional redundancy bits. This technique reduces the number of read operations, because the OP area is accessed only if the first ECC decoding attempt fails.

In some embodiments, the second ECC decoding attempt uses only the additional redundancy bits read from the OP area, and disregards the redundancy bits read from the nominal area. In alternative embodiments, the second decoding attempt considers the redundancy bits read from both the nominal area and the OP area. This latter technique is sometimes referred to as incremental encoding. Some aspects of incremental encoding are addressed in U.S. Patent Application Publication 2008/0282106, which is assigned to the assignee of the present patent application and whose disclosure is incorporated herein by reference. Some aspects of segmented storage of data and redundancy information are also addressed in U.S. patent application Ser. No. 12/063,544, which is assigned to the assignee of the present patent application and whose disclosure is incorporated herein by reference.

In some embodiments, the size of the OP area is modified along the lifetime of the memory device, e.g., based on the number of programming and erasure cycles the device has gone through, the number of identified bad blocks, or using any other suitable criterion.

Additional Embodiments and Variations

In some embodiments, system 20 identifies memory cells that are likely to suffer from severe threshold voltage drift during the power shut-off, and stores information regarding these cells for use in subsequent data readout. The system can identify a group of cells that is likely to exhibit high drift, for example, by reading the cells a short period of time (e.g., several minutes) after programming, and measuring the threshold voltage drift during this period. For example, the system may store the estimated short-time drift measured on the cells, and use this estimate in positioning read thresholds when reading the cells after the power shut-off.

As another example, the system may predict the likelihood of a given cell group (e.g., an erasure block) to suffer from severe threshold voltage shift by examining the statistical distribution of threshold voltages after the (one or more) first programming pulses. As yet another example, the system may predict the likelihood of a given cell group to suffer from severe threshold voltage shift based on the number of programming pulses needed to program the cells. Other parameters that can be used for predicting whether a given cell group is likely to exhibit large threshold voltage shift comprise, for example, the number of programming and erasure cycles that the cells group has gone through, or the time that elapsed since the last programming operation applied to the cells. Having identified the sensitive cell groups, the system may store any suitable information regarding these cells for use in recovery following the power shut-off.

In some embodiments, upon receiving a notification that power shut-off is imminent, system 20 stores a certain amount of known data in a certain group of memory cells (e.g., in a dedicated block, sometimes referred to as a pilot block). When power is restored, the system reads this memory cell group, and uses the read results to assess the effect of the shut-off on the data stored (re-programmed) in the other memory cells. The system may, for example, analyze the statistical properties of the threshold voltage distribution in the memory cells of the pilot block, such as the distribution decay properties ("distribution tails") or variance. Alternatively, the system may apply any suitable kind of analysis to the read results of the pilot block. Since the stored data is known a-priori, comparing the read threshold voltages with the known data may indicate the impact of the power shut-off on the data stored in other cells. For example, the system may estimate the threshold voltage drift using this technique.

In some embodiments, system 20 comprises an internal temporary power source (not shown in the figures), e.g., a battery or capacitor. The internal power source provides electrical power to SSD controller 32 and memory devices 28 for a short period of time, which is sufficient for re-programming at least some of the data in the robust storage configuration (i.e., for carrying out step 78 of the method of FIG. 2 above). This configuration is advantageous, for example, when the host is unable to provide the SSD controller with sufficient advance notice of imminent power shut-offs. In such cases, the SSD controller may sense the loss of electrical power automatically, switch to the internal power source and initiate re-programming using the robust storage configuration (while drawing energy from the internal power source). When electrical power resumes, the SSD controller switches back to the external power supply.

As noted above, when electrical power is restored, system 20 reads the re-programmed data and converts it from the robust storage configuration back into the normal storage configuration. During this recovery period, the memory access speed of system 20 may be degraded temporarily. In some embodiments, system 20 supports an interface, which notifies host 24 of this situation. For example, when power is restored, system 20 may send host 24 a notification that memory access speed is temporarily lower. When recovery to the normal storage configuration is completed, system 20 may send the host another notification indicating that memory access speed has returned to normal. Alternatively, any other suitable interface or protocol can be used.

Recovery from Unexpected Power Shut-Off

In the method of FIG. 2 above, data is re-programmed in response to an indication that power shut-off is imminent. In some cases, however, such an advance notice is not available. In other cases, the indication is accepted only a short time period before the power shut-off, a time period that is insufficient for completing the re-programming operation.

In some embodiments, system 20 handles situations of this sort by storing the data twice a-priori, using a normal storage configuration and a robust storage configuration, irrespective of any power shut-off indication. In some embodiments, the two data instances are stored in two separate regions of the memory. In a normal mode of operation, the SSD controller reads the data that was stored using the normal storage configuration. Following a power shut-off, on the other hand, the SSD controller reads the data that was stored using the robust storage configuration. As noted above, the robust storage configuration has a longer retention period than the normal storage configuration (e.g., ninety-six hours as opposed to forty-eight hours), and is therefore more likely to succeed in holding the data reliably during power shut-off. Note that this technique does not rely on receiving any sort of advance indication of the power shut-off.

For example, SSD controller 32 may encode the data using two different ECCs, a baseline ECC and a more robust ECC. Under normal conditions, the SSD controller reads and decodes the data that was encoded with the baseline ECC. Decoding the baseline ECC is typically faster and consumes less power that decoding the robust ECC. Following a power shut-off, however, the SSD controller reads and decodes the more robust ECC, in order to increase the likelihood of successful decoding. In an embodiment, the SSD controller may first attempt to decode the baseline ECC, and revert to the robust ECC only if the initial attempt fails. In alternative embodiments, any of the normal and robust storage configurations described above can also be used.

Other Embodiments and Variations

Although the embodiments described herein mainly address storage in non-volatile memory, the principles of the present invention can also be used in other applications, such as in Dynamic Random Access Memory (DRAM). DRAMs, as are known in the art, require data refreshing at periodic intervals. This periodic refreshing is a dominant factor in the power consumption of DRAM-based host systems. Power consumption is of particular importance when the host system is in standby mode. In some embodiments, a memory system can store data in a DRAM using a normal storage configuration, which has a certain data retention period, while the host system operates in a normal mode. When accepting an indication that the host system is about to switch to standby mode, the memory system can re-program the DRAM using a robust storage configuration having a longer retention period. Any suitable kind of robust storage configuration, such as the robust storage configurations described in this patent application, can be used for this purpose. For example, the memory system may re-program the DRAM using a storage configuration having a stronger ECC, less bits or programming levels per cell, more accurate programming, higher programming voltages, and/or any other suitable configuration having a longer retention period.

The longer retention period of the robust storage configuration enables the data stored in the DRAM to remain reliable, even if the refreshing operation is performed at a lower frequency. Thus, the memory system refreshes the DRAM at a lower frequency during the standby mode, in comparison with the refresh frequency used during normal operation. As a result, the power consumption during standby is reduced considerably.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage in a non-volatile memory, the method comprising:
    while the non-volatile memory is supplied with electrical power, storing data in the non-volatile memory using a first storage configuration;
    after storing the data, accepting an indication that shut-off of the electrical power is imminent; and
    responsively to the indication and before the shut-off, re-programming at least some of the data in the non-volatile memory using a second storage configuration,
    wherein the first storage configuration has a first data retention period, and wherein the second storage configuration has a second data retention period, longer than the first data retention period.

2. The method according to claim 1, wherein the electrical power is supplied from a host system, and wherein accepting the indication comprises receiving from the host system a notification that the shut-off is imminent.

3. The method according to claim 1, wherein the non-volatile memory is comprised in a storage device, which is removably connected to a host system and which receives the electrical power from the host system, and wherein the shut-off is caused by removal of the storage device from the host system.

4. The method according to claim 3, wherein the storage device comprises a Solid-State Disk (SSD).

5. The method according to claim 1, wherein the non-volatile memory comprises a plurality of analog memory cells, wherein storing the data using the first storage configuration comprises programming a first group of the analog memory cells using a first number of programming states, and wherein re-programming the at least some of the data comprises programming a second group of the memory cells using a second number of the programming states, which is less than the first number.

6. The method according to claim 1, wherein storing the data using the first storage configuration comprises encoding the stored data using a first Error Correction Code (ECC) having a first error correction capability, and wherein re-programming the at least some of the data comprises encoding the at least some of the data using a second Error Correction Code (ECC) having a second error correction capability, which is higher than the first error correction capability.

7. The method according to claim 1, wherein the non-volatile memory comprises a plurality of analog memory cells, wherein storing the data using the first storage configuration comprises programming a first group of the memory cells using a first sequence of programming pulses having a first programming step size, and wherein re-programming the at least some of the data comprises programming a second group of the memory cells using a second sequence of the programming pulses having a second programming step size, which is smaller than the first programming step size.

8. The method according to claim 1, wherein storing the data using the first storage configuration comprises pre-equalizing the stored data using a first pre-equalization scheme having a first interference cancellation level, and wherein re-programming the at least some of the data comprises pre-equalizing the at least some of the data using a second pre-equalization scheme having a second interference cancellation level, which is better than the first interference cancellation level.

9. The method according to claim 8, wherein storing the data using the first storage configuration comprises refraining from pre-equalizing the stored data.

10. The method according to claim 1, wherein the non-volatile memory comprises a plurality of analog memory cells, wherein storing the data using the first storage configuration comprises programming a first group of the memory cells using one or more first voltages, and wherein re-programming the at least some of the data comprises programming a second group of the memory cells using one or more second voltages, at least one of which is higher than a respective first voltage.

11. The method according to claim 10, wherein the voltages comprise at least one voltage type selected from a group of types consisting of programming voltages and pass voltages.

12. The method according to claim 1, wherein the non-volatile memory comprises a plurality of analog memory cells, wherein storing the data using the first storage configuration comprises programming a first group of the analog memory cells using first programming states that occupy a first range, and wherein re-programming the at least some of the data comprises programming a second group of the memory cells using second programming states that occupy a second range, which is wider than the first range.

13. The method according to claim 1, and comprising, responsively to determining that the electrical power has been restored following the shut-off, restoring the re-programmed data in the non-volatile memory from the second storage configuration to the first storage configuration.

14. The method according to claim 13, wherein restoring the re-programmed data comprises reading the re-programmed data using a first read operation having a first reading accuracy, which is higher than a second reading accuracy of a second read operation used for reading the data stored using the first storage configuration.

15. The method according to claim 14, wherein the non-volatile memory comprises a plurality of analog memory cells, and wherein reading the re-programmed data comprises reading the memory cells using a first number of read thresholds, which is higher than a second number of the read thresholds used in the second read operation.

16. The method according to claim 14, wherein reading the re-programmed data comprises applying to the re-programmed data a first signal processing scheme having a first performance level, which is higher than a second performance level of a second signal processing scheme used in the second read operation.

17. The method according to claim 16, wherein applying the first signal processing scheme comprises applying a first Error Correction Code (ECC) decoding scheme having a first error correction capability, which is higher than a second error correction capability of a second ECC decoding scheme used in the second read operation.

18. The method according to claim 16, wherein applying the first signal processing scheme comprises applying a first interference cancellation scheme having a first interference cancellation level, which is higher than a second interference cancellation level of a second interference cancellation scheme used in the second read operation.

19. The method according to claim 14, wherein the second read operation operates on hard decoding metrics computed for the stored data, and wherein reading the re-programmed data comprises computing soft decoding metrics from the re-programmed data and decoding the re-programmed data using the soft decoding metrics.

20. The method according to claim 14, wherein the non-volatile memory comprises a plurality of analog memory cells, and wherein reading the re-programmed data comprises reading the memory cells using one or more first read voltages, at least one of which is higher than a respective second read voltage used in the second read operation.

21. The method according to claim 14, wherein the non-volatile memory comprises a plurality of analog memory cells, and wherein reading the re-programmed data comprises re-reading the memory cells a first number of times, which is larger than a second number of times the memory cells are read in the second read operation.

22. The method according to claim 13, and comprising storing known data in a part of the non-volatile memory before the shut-off, and assessing an impact of the shut-off on the re-programmed data by reading the part of the non-volatile memory after the electrical power has been restored.

23. The method according to claim 13, and comprising outputting a notification, which indicates that access speed to the non-volatile memory is temporarily degraded during a time period in which the re-programmed data is restored from the second storage configuration to the first storage configuration.

24. The method according to claim 1, wherein accepting the indication comprises sensing a loss of the electrical power.

25. The method according to claim 1, wherein re-programming the at least some of the data comprises switching to a temporary power source responsively to the indication, and re-programming the at least some of the data while drawing energy from the temporary power source.

26. The method according to claim 1, wherein the non-volatile memory comprises a plurality of analog memory cells, and comprising:
- identifying a group of the memory cells that are expected to distort the re-programmed data during the shut-off;
- storing information related to the identified memory cells; and
- recovering the data re-programmed in the identified memory cells using the stored information.

27. A method for data storage in a non-volatile memory, the method comprising:
- while the non-volatile memory is supplied with electrical power, storing data in the non-volatile memory using a first storage configuration;
- after storing the data, accepting an indication that shut-off of the electrical power is imminent; and
- responsively to the indication and before the shut-off, re-programming at least some of the data in the non-volatile memory using a second storage configuration,
- wherein the non-volatile memory is partitioned into a normal storage area and an over-provisioning storage area, and wherein re-programming the at least some of the data comprises storing a first part of the re-programmed data in the normal storage area, and a second part of the re-programmed data in the over-provisioning storage area.

28. The method according to claim 27, and comprising making an attempt to recover the re-programmed data using only the first part, and, responsively to a failure of the attempt, recovering the re-programmed data using both the first and the second parts.

29. Apparatus for data storage, comprising:
- an interface, which is coupled to communicate with a non-volatile memory; and
- circuitry, which is coupled to store data in the non-volatile memory using a first storage configuration while the non-volatile memory is supplied with electrical power, to accept, after storing the data, an indication that shut-off of the electrical power is imminent, and, responsively to the indication and before the shut-off, to re-program at least some of the data in the non-volatile memory using a second storage configuration,
- wherein the first storage configuration has a first data retention period, and wherein the second storage configuration has a second data retention period, longer than the first data retention period.

30. The apparatus according to claim 29, wherein the electrical power is supplied from a host system, and wherein the circuitry is coupled to receive from the host system a notification that the shut-off is imminent.

31. The apparatus according to claim 29, wherein the non-volatile memory is comprised in a storage device, which is removably connected to a host system and which receives the electrical power from the host system, and wherein the shut-off is caused by removal of the storage device from the host system.

32. The apparatus according to claim 31, wherein the storage device comprises a Solid-State Disk (SSD).

33. The apparatus according to claim 29, wherein the circuitry is coupled to restore the re-programmed data in the non-volatile memory from the second storage configuration to the first storage configuration responsively to determining that the electrical power has been restored following the shut-off.

34. The apparatus according to claim 33, wherein the circuitry is coupled to restore the re-programmed data by reading the re-programmed data using a first read operation having a first reading accuracy, which is higher than a second reading accuracy of a second read operation used for reading the data stored using the first storage configuration.

* * * * *